US008830002B2

(12) United States Patent
Yeung et al.

(10) Patent No.: US 8,830,002 B2
(45) Date of Patent: *Sep. 9, 2014

(54) METHODS, ALGORITHMS, CIRCUITS, AND SYSTEMS FOR DETERMINING A REFERENCE CLOCK FREQUENCY AND/OR LOCKING A LOOP OSCILLATOR

(75) Inventors: Ken Yeung, Cupertino, CA (US); Hedley Rainnie, Santa Clara, CA (US)

(73) Assignee: Marvell World Trade Ltd., St. Michael (BB)

( * ) Notice: Subject to any disclaimer, the term of this patent is extended or adjusted under 35 U.S.C. 154(b) by 183 days.

This patent is subject to a terminal disclaimer.

(21) Appl. No.: 13/332,833

(22) Filed: Dec. 21, 2011

(65) Prior Publication Data

US 2012/0146691 A1   Jun. 14, 2012

Related U.S. Application Data

(63) Continuation of application No. 12/578,536, filed on Oct. 13, 2009, now Pat. No. 8,089,318.

(60) Provisional application No. 61/106,371, filed on Oct. 17, 2008.

(51) Int. Cl.
*H03L 7/06* (2006.01)
*H03L 7/16* (2006.01)
*G06F 1/12* (2006.01)
*H03L 7/08* (2006.01)

(52) U.S. Cl.
CPC .. *H03L 7/06* (2013.01); *G06F 1/12* (2013.01); *H03L 7/0807* (2013.01)
USPC .................. 331/18; 331/1 A; 331/44; 327/156

(58) Field of Classification Search
USPC ........... 331/18, 25, 16, 1 A, 44; 327/156, 159
See application file for complete search history.

(56) References Cited

U.S. PATENT DOCUMENTS

| 5,764,712 A | 6/1998 | Branstad et al. |
| 6,070,248 A | 5/2000 | Yu et al. |

(Continued)

FOREIGN PATENT DOCUMENTS

| CN | 1717892 | 1/2006 |
| CN | 1751440 | 3/2006 |
| JP | 6-309061 | 11/1997 |

OTHER PUBLICATIONS

2st Office Action issued on Jul. 30, 2013 from related/corresponding Chinese Patent Appl. No. 200980141141.2 filed Sep. 21, 2011 (13 pages).

(Continued)

*Primary Examiner* — Ryan Johnson

(57) ABSTRACT

Apparatuses, methods, systems, algorithms, and circuits for reference clock frequency determination are disclosed. In one embodiment, a circuit for detecting a reference clock frequency can include a clock counter configured to count a number of cycles of the reference clock over a predetermined portion of a sleep clock to provide a reference clock cycle count, where the sleep clock has a known frequency and a predetermined accuracy; a frequency estimator configured to estimate the reference clock frequency from the reference clock cycle count and the known frequency of the sleep clock; and a frequency selector configured to select a closest frequency to the estimated reference clock frequency from a plurality of allowed frequencies.

20 Claims, 6 Drawing Sheets

(56) References Cited

U.S. PATENT DOCUMENTS

| 6,831,523 | B1 | 12/2004 | Pastorello et al. |
| 8,089,318 | B2 * | 1/2012 | Yeung et al. ............... 331/18 |
| 2003/0043766 | A1 | 3/2003 | McDonough et al. |
| 2006/0001464 | A1 | 1/2006 | Yokozeki |
| 2006/0133553 | A1 | 6/2006 | Convent et al. |
| 2007/0213028 | A1 | 9/2007 | Shohara et al. |
| 2009/0273378 | A1 | 11/2009 | Mangnall et al. |

OTHER PUBLICATIONS

Written Opinion of the International Searching Authority; International Application No. PCT/US2009/060665; Dated Dec. 10, 2009; International Searching Authority/United States, Commissioner for Patents, Alexandria, Virginia.
International Search Report issued for International Application No. PCT/US2009/060665; Dated Dec. 10, 2009; International Searching Authority/United States, Commissioner for Patents, Alexandria, Virginia.
1st Office Action issued on Nov. 30, 2012 in related/corresponding Chinese Patent Appl. No. 200980141141.2 filed Sep. 21, 2011.
3rd Office Action issued Nov. 19, 2013 in related/corresponding Chinese Patent Appl. No. 200980141141.2 filed Sep. 21, 2011.
Extended European Search Report mailed Mar. 21, 2014 from related/corresponding European Patent Appl. No. 09821190.7.
Office Action mailed Oct. 16, 2012 from related/corresponding Japanese Patent Appl. No. 2011-532213.

* cited by examiner

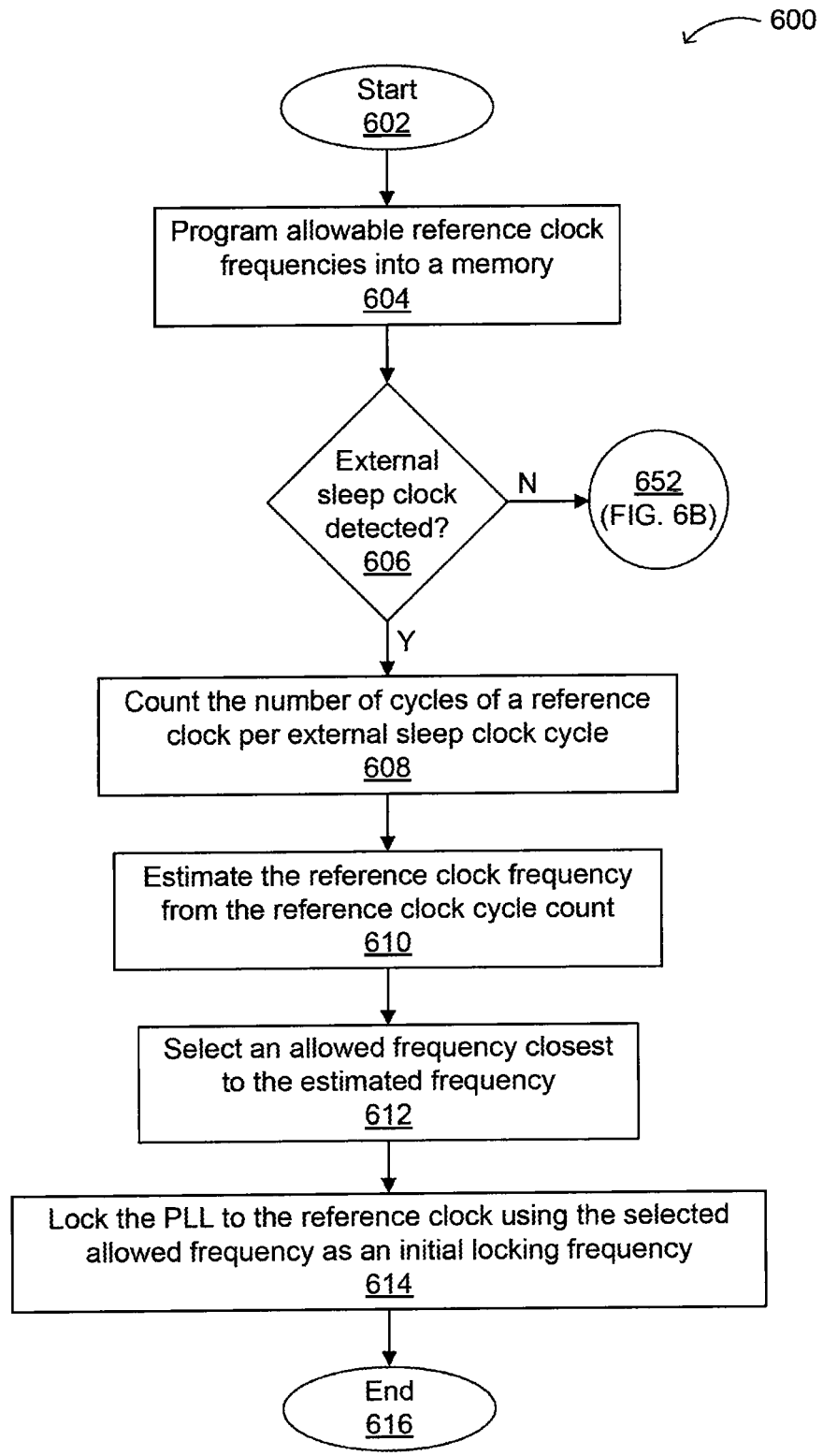

METHODS, ALGORITHMS, CIRCUITS, AND SYSTEMS FOR DETERMINING A REFERENCE CLOCK FREQUENCY AND/OR LOCKING A LOOP OSCILLATOR

This application is a continuation of U.S. patent application Ser. No. 12/578,536, filed on Oct. 13, 2009 (which issued as U.S. Pat. No. 8,089,318), which claims the benefit of U.S. Provisional Patent Application No. 61/106,371, filed on Oct. 17, 2008, each of which is incorporated herein by reference in its entirety.

FIELD OF THE INVENTION

The present invention generally relates to the field of integrated circuits. More specifically, embodiments of the present disclosure pertain to circuits and methods for determining a reference clock frequency and/or locking a loop oscillator, such as a phase-locked loop (PLL).

DISCUSSION OF THE BACKGROUND

Phase-locked loop (PLL) circuitry may be used to generate and control one or more clock signals to be propagated throughout an integrated circuit (IC). In system-on-a-chip (SOC) and other IC applications, such PLLs have limited lockable frequency ranges. To allow PLLs to lock despite such limited lockable frequency ranges, a frequency of a reference clock can be provided to the PLL upon power-up or initialization to facilitate locking onto the reference clock for generation of output PLL clocks.

Many ICs also support a number of different reference clock frequencies. In one example, as many as ten different frequencies can be accommodated by a single IC (e.g., an SOC). Some approaches include the use of four strap pins to encode the different reference clock frequencies. In such approaches, the SOC, IC and/or application can be programmed to support a particular reference clock frequency. However, the strap pin approach has drawbacks including increased printed-circuit board (PCB) space since one or more additional external resistor(s) are required, greater on-chip real estate for input buffer, electrostatic discharge (ESD), decoder, and other associated circuitry, and a resultant increase in costs.

SUMMARY OF THE INVENTION

Embodiments of the present disclosure relate to circuits and methods for determining a frequency of a reference clock.

In one aspect, the disclosure concerns a circuit for detecting a frequency of a reference clock, the circuit comprising a clock counter configured to count a number of cycles of the reference clock over a predetermined portion of a sleep clock to provide a reference clock cycle count, a frequency estimator configured to estimate the frequency of the reference clock based on the reference clock cycle count, and a frequency selector configured to select a closest frequency to the estimated reference clock frequency from a plurality of allowed frequencies. In certain embodiments, the sleep clock is an external sleep clock, and in other embodiments, the sleep clock is an internal sleep clock.

In the case of an internal sleep clock, the circuit can further comprise a decoder configured to decode a plurality of inputs and select one of a plurality of allowed frequency groups (each of which includes a subset of unique allowed frequencies) based on the inputs. The frequency selector can be configured to select a frequency closest to the estimated reference clock frequency from a selected group of allowed frequencies.

In various embodiments, the circuit can further comprise an input configured to supply the sleep clock to the circuit, and/or a phase-locked loop (PLL) configured to lock onto the reference clock using the closest frequency as an initial frequency. In addition, the frequency selector can further comprise a memory configured to store the plurality of allowed frequencies, and/or a comparator configured to compare the closest frequency to at least a subset of the plurality of allowed frequencies.

In another aspect, the disclosure concerns a method of determining a frequency of a reference clock. The method generally comprises counting a number of cycles of the reference clock over a predetermined portion of a sleep clock to provide a reference clock cycle count, estimating the frequency of the reference clock based on the reference clock cycle count and a frequency of the sleep clock, and selecting a closest frequency to the estimated reference clock frequency from a plurality of allowed frequencies. The predetermined portion of the sleep clock can comprise an integer number of cycles or phases of the sleep clock. In various embodiments, the method further comprises programming the plurality of allowed frequencies into a memory and/or providing the closest frequency to a phase-locked loop (PLL), and locking the PLL to the reference clock using the closest frequency.

In alternative embodiments, the sleep clock can be external or internal. In the latter case, the method can further comprise decoding a plurality of encoder inputs to select one of a plurality of allowed frequency groups. Each allowed frequency group generally includes a subset of unique allowed frequencies, and the closest frequency is generally selected from the selected allowed frequency group.

The circuits, architectures, systems, methods, algorithms and software of the present disclosure advantageously provide a mechanism for reliably determining a frequency of a reference clock, while at the same time, reducing or eliminating the dedicated use of strap or other input pins for doing so. The present approach can therefore reduce costs of manufacturing both the IC and a printed circuit board including the IC, as well as reduce board space. These and other advantages of the present invention will become readily apparent from the detailed description of various embodiments below.

BRIEF DESCRIPTION OF THE DRAWINGS

FIG. 6A is a flow diagram showing a first method of determining a reference clock frequency in accordance with embodiments of the present disclosure.

DETAILED DESCRIPTION

Figure 1:
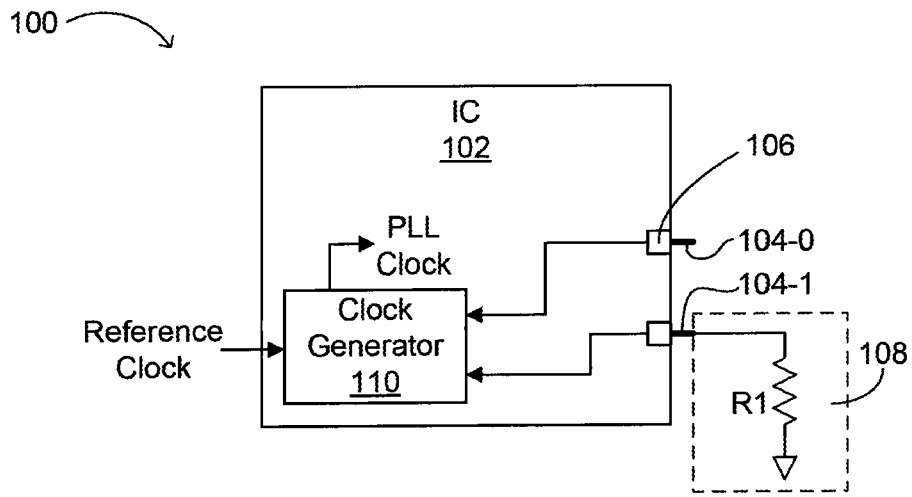
FIG. 1 is a block schematic diagram showing an integrated circuit (IC) with encoder inputs in accordance with various embodiments of the present disclosure.

Reference will now be made in detail to embodiments of the disclosure, examples of which are illustrated in the accompanying drawings. While the invention will be described in conjunction with various embodiments, it will be understood that the described embodiments are not intended to limit the invention. On the contrary, the disclosure is intended to cover alternatives, modifications and equivalents that may be included within the spirit and scope of the disclosure as defined by the appended claims. Furthermore, in the following detailed description, numerous specific details are set forth in order to provide a thorough understanding of the present disclosure. However, the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "signal(s)" and "waveform(s)" may be used interchangeably, however, these terms are also given their art recognized meanings. Also, for convenience and simplicity, the terms "clock," "time," "rate," "period" and "frequency" may be used interchangeably, as well as the terms "data," "data stream," and "information," and in general, use of one such form generally includes the others, unless the context of the use unambiguously indicates otherwise. The terms "node(s)," "input(s)," "output(s)," and "port(s)" may be used interchangeably, as well as the terms "connected to," "coupled with," "coupled to," and "in communication with" (which terms also refer to direct and/or indirect relationships between the connected, coupled and/or communicating elements, unless the context of the term's use unambiguously indicates otherwise). However, these terms are also generally given their art-recognized meanings.

The disclosure, in its various aspects, will be explained in greater detail below with regard to embodiments.

Particular embodiments allow for automatic determination of a reference clock frequency such that an associated phase-locked loop (PLL) can be initialized and/or locked onto the reference clock. For example, a separate "sleep" clock with a known frequency and frequency accuracy or tolerance can be used to estimate the reference clock frequency. Various embodiments can utilize one of two different approaches depending on whether the sleep clock is internally generated within a chip or device, or externally supplied thereto, for frequency selection based on the frequency estimate. Generally, an externally supplied sleep clock has frequency within a certain accuracy, resulting in a relatively simple reference clock frequency selection, while an internally supplied sleep clock is generally less accurate, and determination of a frequency thereof can benefit from a more complex and/or rigorous solution. In any event, particular embodiments allow for determining the reference clock frequency using either type of sleep clock.

FIG. 1 shows a block diagram 100 of an integrated circuit (IC) with encoder inputs in accordance with embodiments of the present disclosure. For example, IC 102 can be a system-on-a-chip (SOC), application specific integrated circuit (ASIC), application specific standard product (ASSP), processor (e.g., microprocessor, graphics processor, video processor, or digital signal processor [DSP]), controller (e.g., microcontroller), chipset, network interface chip (e.g., transceiver, physical layer [PHY] chip, media access controller [MAC] chip), PC peripheral interface chip, storage medium interface chip, wireless communications chip (e.g., RF chip), or any other suitable type of IC. Also, the encoder inputs 104 can include external pins, where the input connections to the IC are tied high or low to indicate a particular binary state, such as to convey a customer preference (e.g., reference clock frequency). Encoder inputs can also involve any other suitable programming mechanism (e.g., fuse programming, metal-layer programming, EPROM programming, circuit board programming, register programming, user software-based interface programming, etc.). IC 102 can include clock generator circuit 110 that receives a reference clock, and supplies one or more PLL clocks for usage on IC 102. While the reference clock is shown in the particular example of FIG. 1 as being input to IC 102, this clock can alternatively be generated on-chip, such as by using a voltage-controlled oscillator (VCO), crystal oscillator, an RC oscillator, or other suitable oscillator. For cases where an internal sleep clock (not shown) is available, some (e.g., one, two, three, etc.) encoder inputs 104 (e.g., 104-0 and 104-1) can be used to select a group of allowed frequencies, as will be discussed in more detail below. When encoder inputs 104 comprise external pins, associated circuitry 106 on IC 102, as well as pin bias circuitry 108 (e.g., including resistor R1 to ground) may also be used. For example, associated circuitry 106 can include pull-up resistors to provide a default selection at encoder inputs 104. Other types of circuitry (e.g., logic circuit, state machine, etc.) can be used to convey a default state. In addition, when the encoder inputs comprise external pins, the encoder inputs 104 may be time-multiplexed and used as regular functional pins (e.g., I/O pins, control signal pins, etc.) after a power-up phase of IC 102.

Clock Generator Including Reference Clock Frequency Determining Circuit

Figure 2:
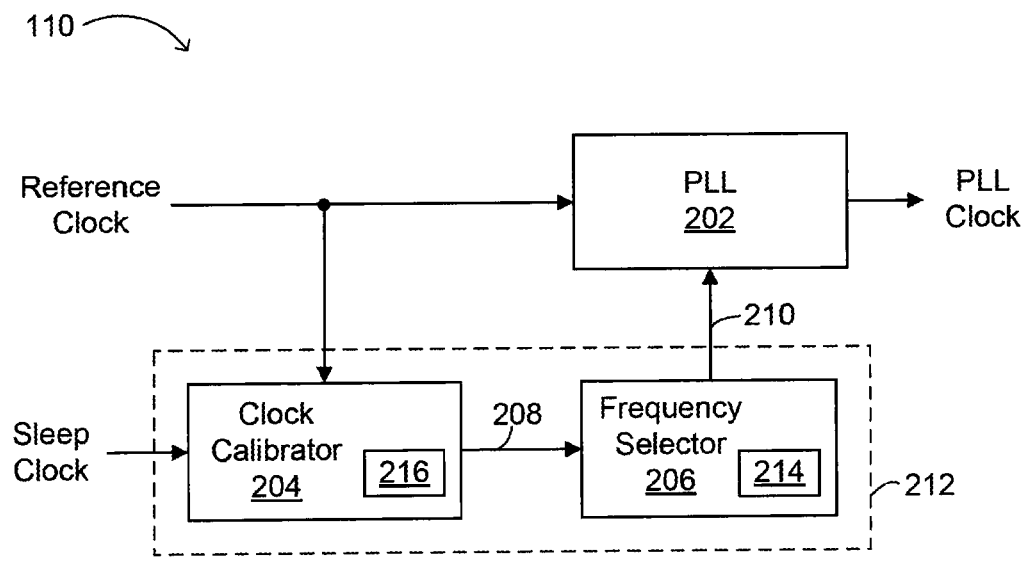
FIG. 2 is a block schematic diagram showing a clock generator in accordance with embodiments of the present disclosure.

FIG. 2 shows a block diagram of a clock generator 110 in accordance with embodiments of the present invention. Generally, clock generator 110 includes PLL 202 and initialization circuit 212. PLL 202 can receive the reference clock (e.g., generated by a crystal oscillator [not shown] or received at an external pin or input), and supply one or more PLL clocks to IC 102. Because PLL 202 may have a limited frequency locking range, an initialization circuit 212 can provide an initial determined frequency of the reference clock to assist PLL 202 in locking onto the reference clock. This way, PLL 202 can be effectively targeted to attempt locking to the appropriate reference clock frequency. In some cases, the initial frequency may not be exactly the same as the reference clock frequency, but PLL 202 may still lock to the appropriate reference clock frequency if the difference between the initial frequency and the reference clock frequency is within the lockable frequency range of PLL 202.

In particular embodiments, a sleep clock (e.g., a continuous background and/or low power mode clock) can be used to estimate a frequency of the reference clock. Any other clock with a known frequency within a given accuracy, frequency margin, or variable frequency range, could also be used in certain embodiments. The estimate can be used in the selection of a reference clock frequency for supply at signal 210 to PLL 202. Clock calibrator 204 can receive the reference clock and the sleep clock, and may use the sleep clock to estimate the reference clock frequency. For example, clock calibrator 204 can count a number of reference clock cycles for a given sleep clock period, or other suitable portion of the sleep clock, and use that clock count to provide an estimated reference clock frequency at signal 208. This can be done because the sleep clock has a known frequency and a known or predetermined accuracy. For example, the known sleep clock frequency can be provided from an external source or from information stored in a memory 216 (e.g., a ROM or a register).

Referring back to FIG. 2, frequency selector 206 can receive estimated frequency 208 and select from among predetermined frequencies stored in memory 214 a closest frequency to send to PLL 202 via signal 210. For example, these predetermined (or allowed) frequencies can include, for example, frequencies of about 12 MHz, about 13 MHz, about 19.2 MHz, about 20 MHz, about 24 MHz, about 26 MHz, about 38.4 MHz, about 40 MHz, about 44 MHz, and about 52 MHz. IC 102 may support such various frequencies for different customers and/or applications. For an externally supplied sleep clock, no particular grouping of the allowed frequencies need be considered for selection of the closest frequency. Rather, one or more comparators can be used to select a closest frequency to the estimated reference clock frequency from among the allowed frequencies.

Frequency selector 206 can include memory 214 (e.g., a read-only memory [ROM]), whereby firmware or other information stored on the ROM may be configured to assist with or implement frequency determination in particular embodiments. In one alternative approach, a driver for an application programming interface (API) can be included in the ROM to allow a user to provide explicit reference clock frequency information via a host interface. In addition, firmware (e.g., hardware and/or software) or other information from a host chip can be downloaded to support multiple build and/or customer versions for various reference clock frequencies. In another alternative approach, an electrically erasable ROM (EEPROM), located on or off-chip, can be utilized to store a reference clock frequency, which can then be accessed and transferred into the on-chip ROM.

The sleep clock as shown in FIG. 2 can be externally provided to IC 102 and/or generated internally within IC 102. Particular embodiments may use the internally supplied sleep clock as a default when no externally supplied sleep clock is detected. An externally supplied sleep clock generally provides improved frequency accuracy relative to an internally supplied sleep clock, but particular embodiments can also accommodate internally supplied sleep clock variations. For example, external sleep clocks are typically available for cell phone systems. However, printer and camera systems may not have a readily accessible external sleep clock, so an internally supplied sleep clock can be made available for these systems.

In this fashion, embodiments of the invention can automatically determine a reference clock frequency using a sleep clock. This can be done regardless of whether the sleep clock is internally or externally supplied to an SOC. This approach may result in lower costs, smaller board size, and increased PLL initialization reliability, as compared to conventional approaches, such as those that use four or more strap pins.

Figure 3:
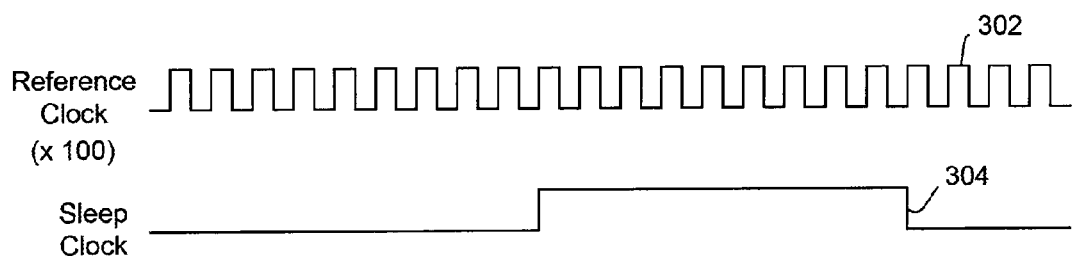
FIG. 3 is a waveform diagram showing reference clock and sleep clock signals in accordance with embodiments of the present disclosure.

FIG. 3 shows a waveform diagram of reference clock and sleep clock signals. For example, the reference clock (e.g., waveform 302) can have a frequency ranging from about 1 MHz to about 100 MHz (e.g., from 10 MHz to 55 MHz), while the sleep clock (e.g., waveform 304) can have a frequency ranging from about 1 kHz to about 100 kHz (e.g., 25 kHz to 40 kHz, and in one implementation, about 32 kHz). Thus, relative to sleep clock waveform 304, reference clock waveform 302 can have an actual period or cycle about $\frac{1}{10}^{th}$ to $\frac{1}{1000}^{th}$ (e.g., about $\frac{1}{100}^{th}$) of that shown in FIG. 3. If an external sleep clock is provided, the frequency accuracy can be ≤1% (e.g., less than 1000 ppm [0.1%]). In one implementation, the predetermined accuracy of the external sleep clock is about ±200 ppm or about ±0.02%. However, the frequency accuracy for an internal sleep clock can be up to 25% (e.g., about ±15% or ±20%). However, particular embodiments can accommodate any frequencies, relations of frequencies (e.g., sleep clock having a higher frequency than the reference clock), and/or accuracies of sleep clocks and/or reference clocks.

Clock Calibrators for Reference Clock Frequency Determination

Figure 4A:
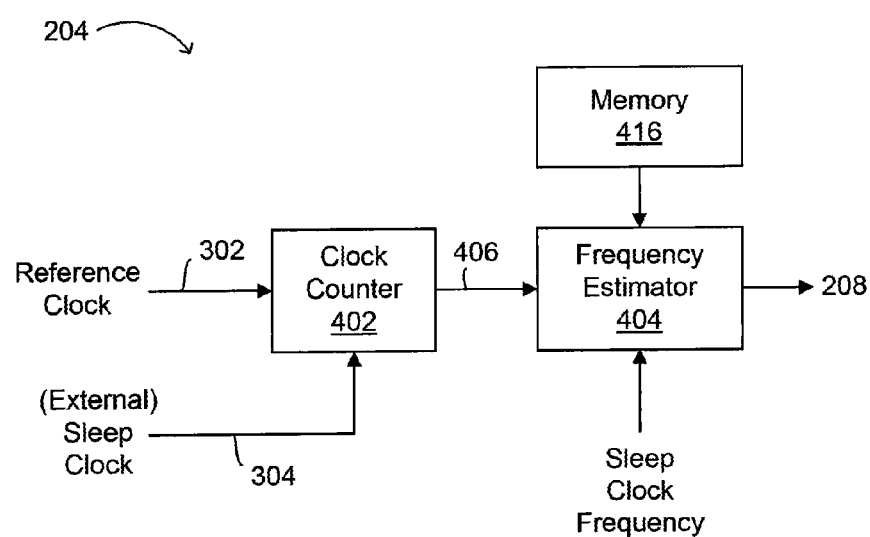
FIG. 4A is a block diagram showing a first clock calibrator in accordance with embodiments of the present disclosure.

FIG. 4A shows a block schematic diagram 204 of a first clock calibrator in accordance with various embodiments of the present disclosure. In this example, an external sleep clock can be provided, and clock counter 402 receives both the reference clock 302 and the sleep clock 304. Clock counter 402 is configured to count a number of cycles of the reference clock 302 for a given portion of the sleep clock 304 (e.g., a period, phase, number of sleep clock cycles, etc.), to provide reference clock cycle count 406. Clock counter 402 can be configured to count based on the particular sleep clock portion used. For example, if a phase of the sleep clock 304 is used as the sleep clock portion, counter 402 can be enabled to count cycles of the reference clock 302 when, e.g., the sleep clock 304 is high. Any other suitable clock arrangements and/or operation can be used to count a number of reference clock cycles relative to the known clock cycle time of the sleep clock. Frequency estimator 404 can receive reference clock cycle count 406 and provide the estimated frequency 208 from the reference clock cycle count 406 and the known frequency (e.g., 32 kHz) of the sleep clock 304. The known sleep clock frequency can be provided to frequency estimator 404 from an external source or from information stored in a memory 416 (e.g., a ROM or a register) on the IC 102. In this fashion, an automatic reference clock frequency estimation can be provided at signal 208. In turn, and referring now to FIG. 2, estimated reference clock frequency signal 208 can be sent to frequency selector 206, which can include a memory 214 for allowed frequency storage (as described herein).

Figure 4B:
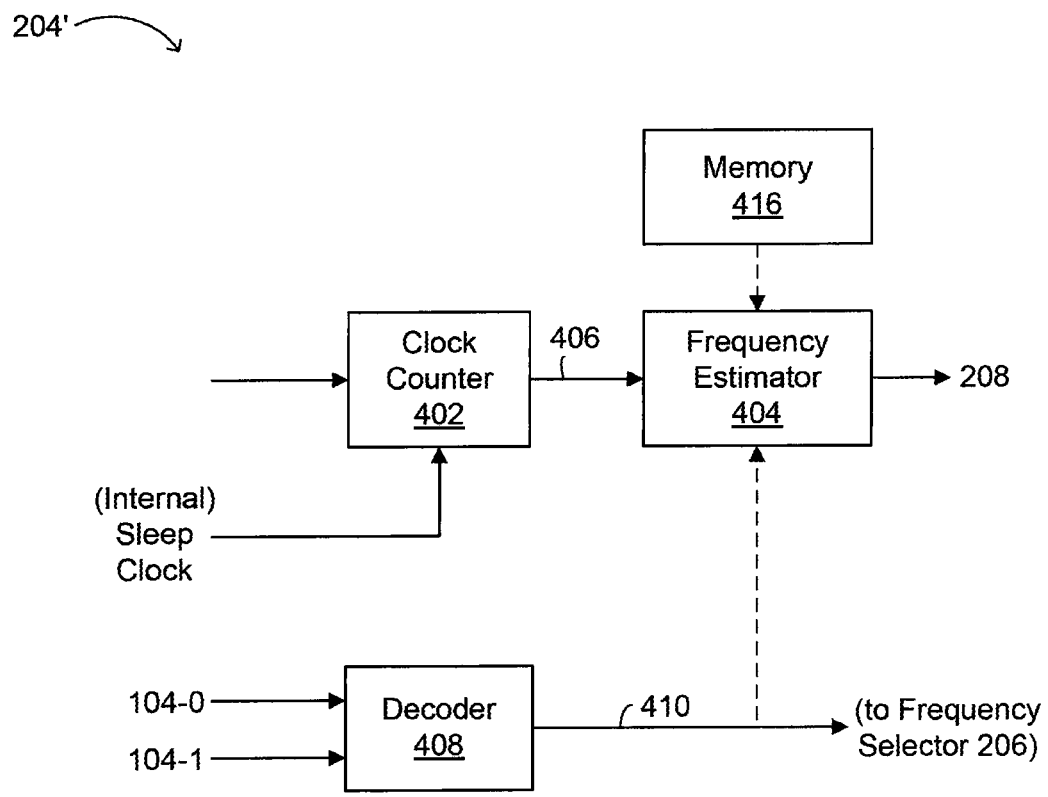
FIG. 4B is a block diagram showing a second clock calibrator in accordance with embodiments of the present disclosure.

FIG. 4B shows a block diagram 204' of a second clock calibrator in accordance with embodiments of the present disclosure. In particular, one or more encoder inputs (e.g., inputs 104-0 and 104-1) can be used to segment the list of allowable or predetermined reference clock frequencies into a plurality of groups (e.g., four groups). Thus, the encoder inputs 104-0 and 104-1 can be decoded by decoder 408 such that a frequency group selection signal 410 indicates a selection of a group of allowed reference clock frequencies (e.g., one of four possible groups). The allowed reference clock frequencies can be grouped as subsets of all possible allowed frequencies, where a spread (or frequency difference) between each of the allowed frequencies in each group is significantly greater than a predetermined accuracy of the sleep clock. For example, each frequency in a given group can differ from the other frequencies in the group by two or more times the predetermined accuracy of the sleep clock. For instance, if the predetermined accuracy of the sleep clock is 15%, a given frequency in the group can be at least 30% higher than the next lower frequency in the group and at least 30% lower than the next higher frequency in the group. This frequency difference in each group provides a sufficient tolerance for an estimate of the reference clock frequency because an accuracy of that estimate is based on the sleep clock accuracy. However, it can be useful to put two different allowed frequencies in different groups when the two frequencies differ by less than the predetermined accuracy of the sleep clock (or by slightly more, for example between one and two times the predetermined accuracy of the sleep clock). For example, such frequency groupings can be as shown below in Table 1, where the frequency difference is indicated as a frequency estimate tolerance.

TABLE 1

| Group | Frequencies (MHz) | Frequency Estimate Tolerance |
|---|---|---|
| 0 | 12, 24, 44 | Up to 45% |
| 1 | 13, 26, 52 | Up to 50% |
| 2 | 19.2, 38.4 | Up to 50% |
| 3 | 20, 40 | Up to 50% |

Similar to the circuit of FIG. 4A, the clock counter 402 of FIG. 4B can count a number of reference clock cycles for a given sleep clock portion, to provide reference clock cycle count 406. In the example of FIG. 4B, frequency estimator 404' can receive reference clock cycle count 406 and group selection signal 410, and provide estimated frequency 208 (which, e.g., can be provided to frequency selector 206 in FIG. 2). Referring back to FIG. 4B, in one embodiment, the estimated frequency 208 is a ratio of the reference clock frequency to the sleep clock frequency. Using the approach described in paragraph [0031] above, the ratio of the reference clock frequency to the sleep clock frequency is sufficiently accurate to select to closest allowed frequency from the group selected by frequency group selection signal 410. In another embodiment, the sleep clock frequency is stored in memory 416 and provided to frequency estimator 404' to provide estimated frequency 208. Alternatively, group selection signal 410 can be provided directly to frequency selector 206 (FIG. 2) in order to narrow a search or reduce the possible number of the stored (allowed) predetermined frequencies for reference clock frequency selection. As discussed above, frequency selector 206 can include memory 214 for storage of predetermined or allowable reference clock frequencies. Frequency selector 206 can select from memory 214, a closest (e.g., using comparator circuitry) of the allowed frequencies to the estimated reference clock frequency 208.

The frequency groupings shown in Table 1 are arranged such that the frequencies within a group have a spread to accommodate the relatively large frequency accuracy variation found in the internally provided sleep clock. Thus as shown, the frequencies in each group (e.g., 12 MHz, 24 MHz, and 44 MHz in group 0) allow for an accurate selection of the reference clock frequency. For example, frequency estimator 404' may arrive at an estimate of 15 MHz for the reference clock using reference clock cycle count 406. Frequency selector 206 can receive group selection signal 410 (either directly or via frequency estimator 404') from strap pin decoder information 408 indicating that group 0 is to be selected. From this information, the reference clock frequency of 12 MHz can be selected as the closest allowed frequency to the estimated 15 MHz in group 0, and provided via signal 210 to PLL 202. For example, the closest allowed frequency determination can be made using comparator circuitry (see, e.g., FIG. 5), and the selection can be performed using appropriate combinatorial logic coupled to memory 214.

In this fashion, an automatic reference clock frequency estimation can be made by using minimal encoder inputs, while still accommodating an internally provided sleep clock having a relatively large frequency accuracy variation (e.g., about +/−15%). When an externally supplied sleep clock is available, the frequency estimate can be used directly to select a closest allowed reference clock frequency from among the predetermined/allowable frequencies stored in memory, and without the use of any encoder inputs, such as external strap pins.

Figure 5:
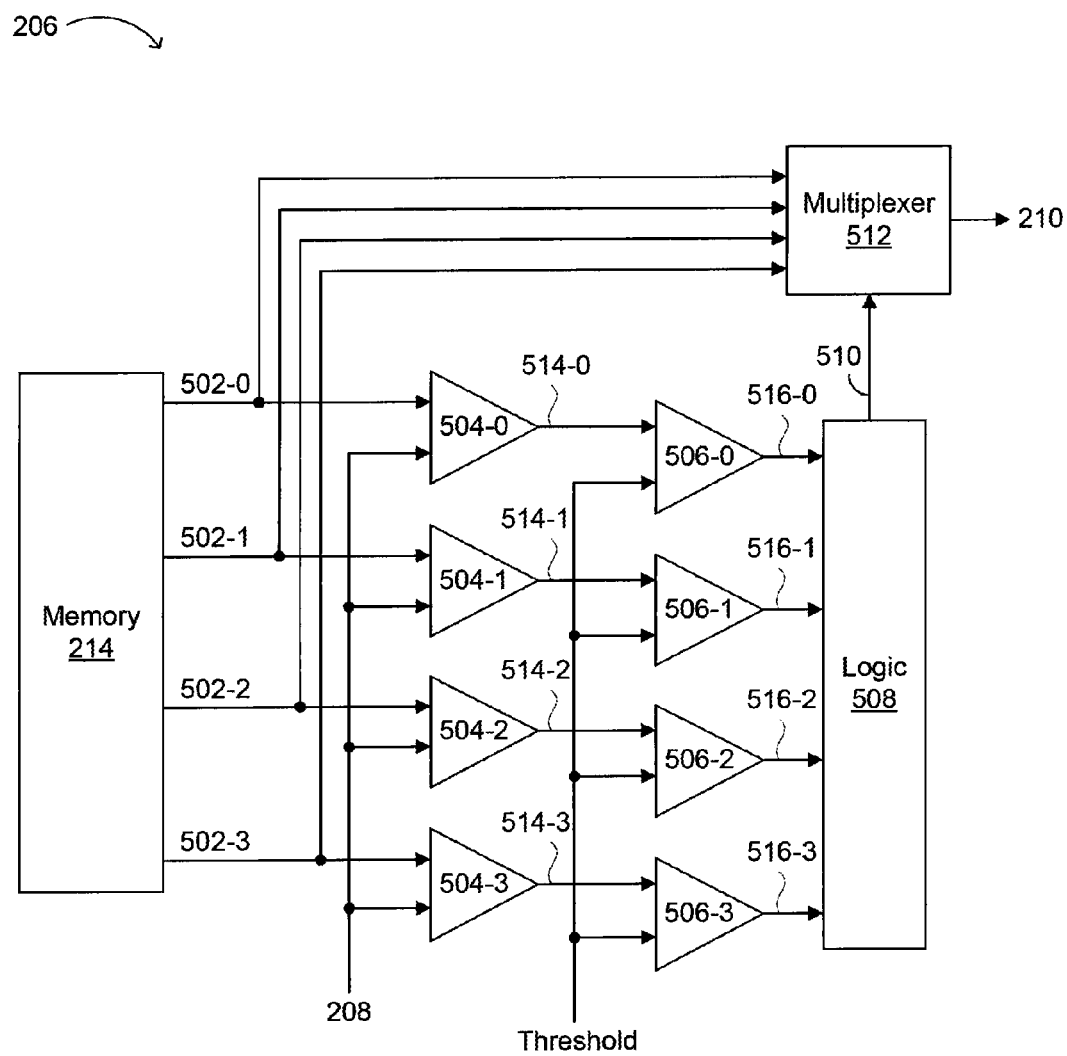
FIG. 5 is a block/schematic diagram showing a frequency selector in accordance with embodiments of the present disclosure.

FIG. 5 shows a block diagram of an embodiment of frequency selector 206. In this particular example, four allowed frequencies 502 are shown, but of course any number of allowed frequencies overall or within a group of allowed frequencies (e.g., for an internally supplied sleep clock) can be accommodated. Allowed frequencies 502-0, 502-1, 502-2, and 502-3 can be accessed from memory 214, and supplied to corresponding comparators 504-0, 504-1, 504-2, and 504-3. Each comparator 504 can also receive estimated frequency signal 208 such that each allowed frequency 502 is compared against the estimated frequency 208. Comparators 504-0, 504-1, 504-2, and 504-3 may provide an analog or digital output 514-0, 514-1, 514-2, and 514-3 representing the difference in the value of the estimated frequency 208 with the value of allowed frequencies 502-0, 502-1, 502-2, and 502-3, respectively. Because the allowed frequencies in a given group generally have differences in values that exceed the known accuracy or variability of the sleep clock frequency, the comparison of the estimated frequency 208 with allowed frequencies 502-0, 502-1, 502-2, and 502-3 results in each of the outputs 514-0, 514-1, 514-2 and 514-3 having different values.

The outputs 514-0, 514-1, 514-2, and 514-3 from each comparator 504 can be fed into a second level comparator 506 (e.g., corresponding comparators 506-0, 506-1, 506-2, and 506-3), for comparison against a predetermined threshold. The predetermined threshold is a digital or analog signal having a value corresponding to the known accuracy or variability of the sleep clock frequency. When the allowed frequencies in a given group generally have differences in values that exceed the known accuracy or variability of the sleep clock frequency, only one of the outputs 514-0, 514-1, 514-2 and 514-3 has a value less than that of the predetermined threshold.

Those skilled in the art will appreciate that a plurality of such threshold comparator stages (e.g., with successively smaller thresholds), comparators 506 with multiple successive thresholds, and/or other logic or circuitry, can be employed to determine a closest allowed frequency 502 to the estimated frequency 208. In this particular example, outputs 516-0, 516-1, 516-2 and 516-3 from comparators 506 can be supplied to logic 508 to determine a closest allowed frequency 502. Generally, the allowed frequency 502-0, 502-1, 502-2, or 502-3 corresponding to the output 516-0, 516-1, 516-2 or 516-3 having the lowest value is the closest allowed frequency. This closest allowed frequency can be indicated to multiplexer 512 via selection signal 510 such that the closest allowed frequency 502 can be output at signal 210 (e.g., for input to PLL 202, as shown in FIG. 2). Thus, logic 508 can be configured to provide an allowed frequency selection signal 510 in response to a comparator output 516 having a lowest value or otherwise indicating the allowed frequency 502 closest to the estimated frequency 208.

Methods of Determining a Reference Clock Frequency

Figure 6B:
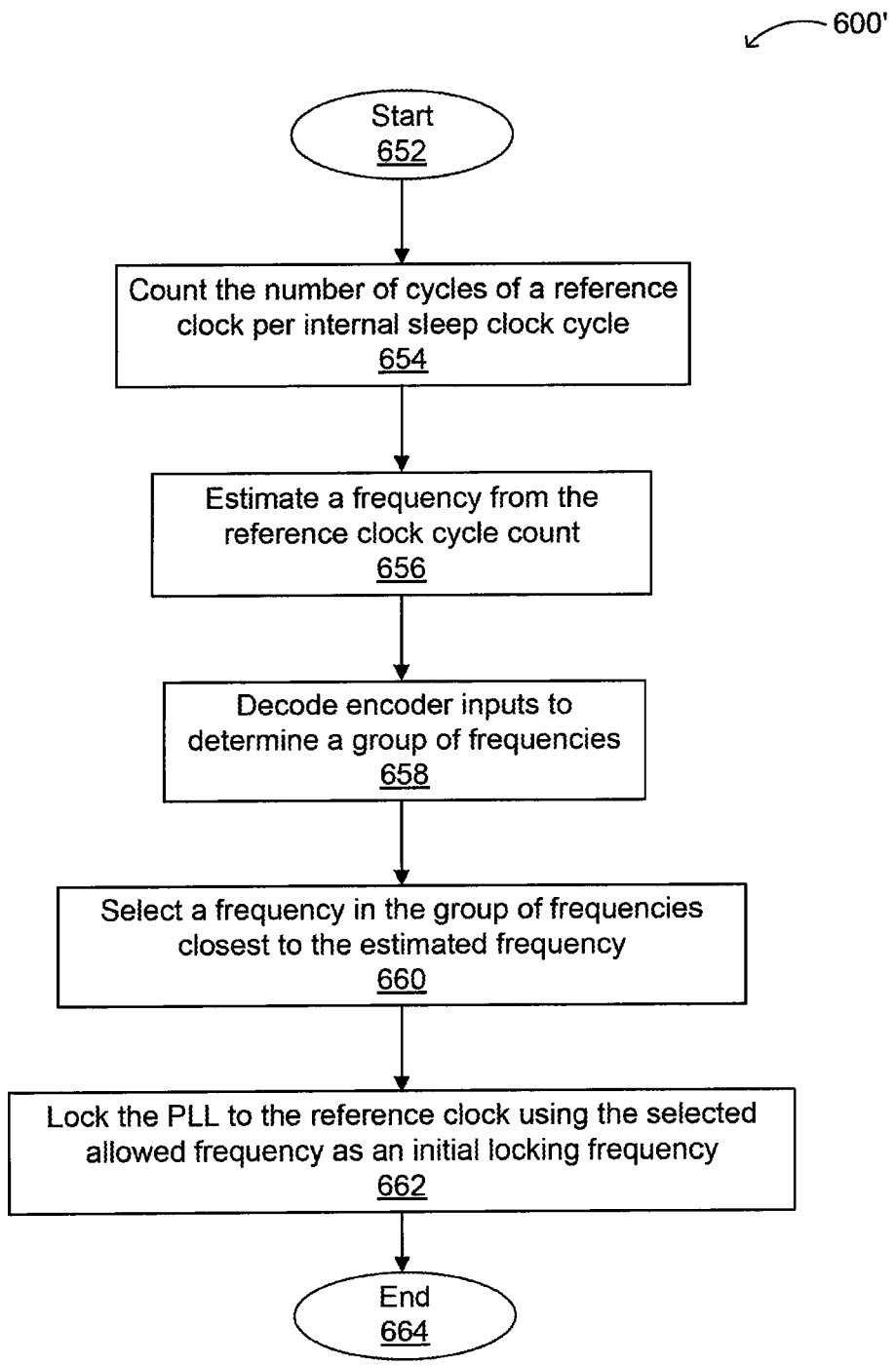
FIG. 6B is a flow diagram showing a second method of determining a reference clock frequency in accordance with embodiments of the present disclosure.

FIG. 6A shows a flow diagram 600 of a first method of determining a reference clock frequency in accordance with embodiments of the present disclosure. At 602, the flow begins, and at 604, allowable reference clock frequencies can be programmed into a memory. For example, a reference clock frequency for each customer and/or application supported by a particular IC can be programmed (e.g., by metal, fuse, user interface, etc.) into memory 214 of FIG. 2. A conventional clock detection circuit can determine whether an external sleep clock is present at the IC (e.g., by detecting transitions of the external sleep clock signal within a certain time period at a corresponding pin, I/O terminal or input buffer), and at 606, if no external sleep clock is detected, then an internal sleep clock can be used as shown in FIG. 6B. At 606, if an external sleep clock is detected, then at 608, the number of cycles of the reference clock per predetermined portion (e.g., phase, cycle or other portion) of the external sleep clock can be counted. At 610, the frequency of the reference clock can be estimated from this reference clock cycle count. At 612, the method further includes selecting an allowed frequency that is closest to the estimated frequency. In one embodiment, the allowed frequencies can be programmed in advance into a ROM on the IC, and the particular allowed frequency values can be selected to support one or more of a variety of customers and/or applications. At 614, the selected frequency can then be sent to a PLL to target the locking frequency and facilitate the PLL in locking onto the reference clock. At 616, the flow is completed.

As discussed above, an externally supplied sleep clock has better frequency accuracy relative to an internal sleep clock, and thus may be a first choice from that standpoint. However, some applications may not provide a sleep clock in this manner, so a default internally generated sleep clock can also be accommodated in particular embodiments.

FIG. 6B shows a flow diagram 600' of a second method of determining a reference clock frequency. At 652, the flow begins, and at 654, the number of cycles of a reference clock per portion of the internal sleep clock (e.g., phase, cycle or other predetermined clock cycle portion) are counted. At 656, the frequency of the reference clock can be estimated from this reference clock cycle count because the sleep clock has a known frequency. At 658, encoder inputs (e.g., strap pins or other fixed-value inputs) can also be decoded (e.g., using decoder 408 of FIG. 4B) to determine a group of frequencies. For example, the frequencies can be grouped as shown above in Table 1. At 660, an allowed frequency in a selected group of frequencies that is closest to the estimated frequency can be selected. At 662, the selected frequency can then be sent to a PLL to target the locking frequency and facilitate the PLL in locking onto the reference clock. At 664, the flow is completed.

In some cases, an EEPROM or other non-volatile or reprogrammable memory may be used to simply store a programmed frequency of the reference clock. If this is the case, part of the sequence (e.g., one or more of the flow blocks) shown in FIGS. 6A-6B can be bypassed, and the reference clock frequency value can simply be passed to the PLL by associated chip logic.

Firmware and/or ROM code can be employed to store instructions and/or otherwise control the timing as to when the PLL receives the target reference clock frequency and is able to begin the locking procedure. For example, the ROM code can set a PLL calibration start register bit (e.g., set to an active state) while waiting for a PLL calibration busy register bit to be activated (e.g., set to '0'). A PLL calibration lock register bit can be checked until an active state (e.g., a value of '1') is detected, thus indicating the PLL is properly locked to the reference clock. When the PLL has locked to the reference clock and is generating proper PLL clock outputs to IC, the firmware and/or ROM code can switch the IC clock to use the PLL clock. This can be accomplished by the activating a clock enable signal to select an output from the PLL.

A fault or error case may occur in some situations where the PLL calibration busy register bit does not change from an active state (e.g., it may be stuck in a high logic state or level), causing the ROM code to wait indefinitely. This can also occur when the PLL calibration busy register bit is set to an active state (e.g., it goes into a low logic state or level), but the PLL calibration lock register bit remains inactive (e.g., it is stuck low). Such error cases can be corrected by interrupting the ROM code using a debugger while the reference clock is being used as a default chip clock. Once the PLL has properly locked to the reference clock (e.g., as indicated by the PLL calibration lock bit going into an active state), the ROM code switches the chip clock to the PLL clock.

Exemplary Software

The present disclosure also includes algorithms, computer program(s) and/or software, implementable and/or executable in a general purpose computer or workstation equipped with a conventional digital signal processor, configured to perform one or more steps of the method and/or one or more operations of the hardware. Thus, a further aspect of the disclosure relates to algorithms and/or software that implement the above method(s). For example, the disclosure may further relate to a computer program, computer-readable medium or waveform containing a set of instructions which, when executed by an appropriate processing device (e.g., a signal processing device, such as a microcontroller, microprocessor or DSP device), is configured to perform the above-described method and/or algorithm.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

CONCLUSION/SUMMARY

Thus, embodiments of the present disclosure provide circuits, architectures, systems, methods, algorithms and software for determining a reference clock frequency and/or locking a loop oscillator, such as a phase-locked loop (PLL). For example, the circuit and method enable accurate and/or reliable determination of a reference clock frequency from either an internal or external sleep clock signal, using relatively simple logic. The architecture and system generally include one or more aspects of the circuit(s), and the algorithms and software generally include one or more aspects of the method(s).

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the invention be defined by the Claims appended hereto and their equivalents.

What is claimed is:

1. A circuit for estimating a frequency of a reference clock, the circuit comprising:
  a counter configured to count a number of cycles of a reference clock over a predetermined portion of a first clock to provide a reference clock cycle count;
  a frequency estimator configured to estimate the frequency of the reference clock based on the reference clock cycle count;
  a selector configured to
    (i) select a first group of frequencies from a plurality of groups of frequencies, each of the plurality of groups of frequencies respectively including a plurality of predetermined frequencies, and
    (ii) select, from among the plurality of predetermined frequencies of the first group of frequencies, a first predetermined frequency that is closest to the estimated reference clock frequency.

2. The circuit of claim 1, wherein the frequency selector comprises:
  a first comparator stage configured to output, for each predetermined frequency of the first group of frequencies, a difference signal indicating a difference between the estimated reference clock frequency and the respective predetermined frequency; and
  a logic configured select the first predetermined frequency, wherein the difference signal corresponding to the first predetermined frequency is less than a first predetermined threshold.

3. The circuit of claim 2, wherein the frequency selector further comprises:
  a second comparator stage configured to compare, for each predetermined frequency of the first group of frequencies, the difference signal to the first predetermined threshold.

4. The circuit of claim 3, wherein the frequency selector further comprises:
  a third comparator stage configured to compare, for each predetermined frequency of the first group of frequencies, the difference signal to a second predetermined threshold that is lower than the first predetermined threshold.

5. The circuit of claim 4, wherein the logic is configured to base its selection on the comparison to the first predetermined threshold if only one of the difference signals is less than the first predetermined threshold, and to base its selection on the second predetermined threshold if only one of the difference signals is less than the second predetermined threshold.

6. The circuit of claim 1, wherein the frequency selector is configured to output, to a multiplexer that inputs each of the predetermined frequencies of the first group of frequencies, a signal indicating which of the predetermined frequencies is determined by the frequency selector to be closest to the estimated reference clock frequency.

7. The circuit of claim 1, wherein the first predetermined frequency selected by the frequency selector is output to a phase locked loop.

8. The circuit of claim 2, wherein the circuit is configured such that:
  if an external sleep signal, from a sleep clock that is external to the circuit, is available to the circuit, then the external sleep clock signal is used by the counter as the first clock signal; and
  if an external sleep clock signal, from a sleep clock that is external to the circuit, is not available at the sleep clock input, then a sleep clock that is internal to the circuit is used by the counter as the first clock signal.

9. The circuit of claim 1, wherein:
  within each group of frequencies, a difference between each predetermined frequency and each other predetermined frequency is greater than an accuracy variation of the first clock; and
  a difference between at least two predetermined frequencies from different groups of frequencies is less than the accuracy variation of the first clock.

10. The circuit of claim 1, wherein the selector comprises:
  a decoder configured to decode a plurality of encoder inputs and to select the first group of frequencies based on a state or value of the encoder inputs; and
  a frequency selector configured to select a closest frequency to the estimated reference clock frequency from the predetermined frequencies of the first group of frequencies.

11. A method comprising:
  counting a number of cycles of a reference clock over a predetermined portion of a first dock to provide a reference dock cycle count;
  estimating the frequency of the reference dock based on the reference clock cycle count;

selecting a first group of frequencies from a plurality of groups of frequencies, each of the plurality of groups of frequencies respectively including a plurality of predetermined frequencies, and selecting, from among the plurality of predetermined frequencies of the first group of frequencies, a first predetermined frequency that is closest to the estimated reference clock frequency.

12. The method of claim 11, further comprising:
outputting, for each predetermined frequency of the first group of frequencies, a difference signal indicating a difference between the estimated reference clock frequency and the respective predetermined frequency; and
wherein the selecting is based on the difference signal corresponding to the first predetermined frequency being less than a first predetermined threshold.

13. The method of claim 12, further comprising:
comparing, for each predetermined frequency of the first group of frequencies, the difference signal to the first predetermined threshold.

14. The method of claim 13, further comprising:
comparing, for each predetermined frequency of the first group of frequencies, the difference signal to a second predetermined threshold that is lower than the first predetermined threshold.

15. The method of claim 14, wherein the selecting of the first predetermined frequency is based on the comparison to the first predetermined threshold if only one of the difference signals is less than the first predetermined threshold and is based on the second predetermined threshold if only one of the difference signals is less than the second predetermined threshold.

16. The method of claim 11, further comprising outputting, to a multiplexer that inputs each of the predetermined frequencies of the first group of frequencies, a signal indicating which of the predetermined frequencies is determined by the frequency selector to be closest to the estimated reference dock frequency.

17. The method of claim 11, further comprising:
outputting the selected first predetermined frequency to a phase locked loop.

18. The method of claim 12, further comprising:
if an external sleep signal, from a sleep clock that is external to the circuit, is available to the circuit, then using the external sleep clock signal as the first clock signal; and
if an external sleep clock signal, from a sleep clock that is external to the circuit, is not available at the sleep clock input, then using a sleep clock that is internal to the circuit as the first clock signal.

19. The method of claim 11, wherein within each group of frequencies, a difference between each predetermined frequency and each other predetermined frequency is greater than an accuracy variation of the first clock, and wherein a difference between at least two predetermined frequencies from different groups of frequencies is less than the accuracy variation of the first clock.

20. The method of claim 11, further comprising:
decoding a plurality of encoder inputs;
selecting the first group of frequencies based on a state or value of the encoder inputs.

* * * * *